United States Patent [19]

Roberts et al.

[11] 3,840,887

[45] Oct. 8, 1974

[54] SELECTIVE IRRADIATION OF GATED SEMICONDUCTOR DEVICES TO CONTROL GATE SENSITIVITY

[75] Inventors: John S. Roberts, Export; Michael W. Cresswell, Pittsburgh, both of Pa.

[73] Assignee: Westinghouse Electric Corporation, Pittsburg, Pa.

[22] Filed: Aug. 25, 1972

[21] Appl. No.: 283,685

[52] U.S. Cl. ........................ 357/30, 357/38, 357/91

[51] Int. Cl. ........................ H01l 15/00

[58] Field of Search ... 317/235 N, 235 AY, 235 AB

[56] References Cited

UNITED STATES PATENTS

| | | | |
|---|---|---|---|
| 3,422,323 | 1/1969 | Whoriskey | 317/235 |
| 3,442,722 | 5/1969 | Bauerlein | 148/178 |
| 3,700,897 | 10/1972 | Low | 250/83 R |

*Primary Examiner*—Martin H. Edlow
*Attorney, Agent, or Firm*—C. L. Menzemer

[57] ABSTRACT

By selective irradiation, the gate sensitivity of gated semiconductor devices such as thyristors and transistors is controlled without changing certain other electrical characteristics of the device. Decreased gate sensitivity is achieved without corresponding increases in forward voltage drop by masking conducting portions of the device against radiation, such as electron radiation, and irradiating gating portions of the device with suitable radiation such as electron radiation. Further, gate sensitivity can be maintained while reducing turn-off times and/or increasing blocking voltages by masking gating portions of the device against radiation, such as electron radiation, and irradiating conducting portions and/or peripheral portions of the device with suitable radiation such as electron radiation.

13 Claims, 6 Drawing Figures

SELECTIVE IRRADIATION OF GATED SEMICONDUCTOR DEVICES TO CONTROL GATE SENSITIVITY

FIELD OF THE INVENTION

The present invention relates to the manufacture of semiconductor devices and particularly high power gated semiconductor devices.

BACKGROUND OF THE INVENTION

In making gated semiconductor devices, many units fail to meet the specifications for which they were designed becuase of excessive gate sensitivity. For example, certain thyristors are rejected as too trigger sensitive if maximum gate current to fire does not exceed 10 milliamps. Other devices cannot be designed with an arbitrarily low gate sensitivity because of the need also for a low forward voltage drop.

The gate sensitivity of a semiconductor device is by definition inversely dependent on the gate current needed to fire or drive the device. Gate current is in turn a function of the injection efficiency ($\gamma$) into a base region and the carrier lifetime ($\tau$) in said base region of the device. Both of these parameters are affected by the impurity concentration ($N_A$) in the base region. Thus, the gate current can be decreased and gate sensitivity increased by decreasing the base impurity concentration. Conversely, increasing the base impurity concentration to decrease gate sensitivity increases the forward voltage drop. Design of a gated semiconductor device has therefore routinely involved a trade-off between gate current and forward voltage drop requirements.

Moreover, rejection of gated devices after manufacture because of excessive gate sensitivity, i.e. too low gate current, has been a problem in the making of semiconductor devices. Sometimes devices with too low gate current can be reclaimed by sandblasting. But the degree and range of control of gate current by sandblasting is limited. Greater precision and wider flexibility in raising the gate current are needed to provide better quantative yields in semiconductor device manufacture.

It has been known to irradiate semiconductor devices for various reasons. For example, it has been described in patent application Ser. No. 324,718, filed Jan. 18, 1973 (assigned to the same assignee as the present application) to "bulk" or indiscriminately irradiate fast switching thyristors to decrease the turn-off time. However, in such instances of irradiation, the gate sensitivity of the device was compromised for the desired parameter. Moreover, it has been described in our copending patent application Ser. No. 283,684, filed Aug. 25, 1972 to selectively irradiate the peripheral portions of junctioned semiconductor devices to increase blocking voltage without significantly affecting forward voltage drop.

The present invention overcomes the difficulties and disadvantages of prior devices. It provides for control of the gate sensitivity of devices previously irradiated and unirradiated. It also provides for the design of devices with electrical characteristics heretofore not readily attainable, if not unattainable.

SUMMARY OF THE INVENTION

The gate sensitivity of semiconductor devices is controlled without significantly affecting other desired electrical parameters of the device. The gate sensitivity is decreased without affecting the conducting properties of a semiconductor device by masking the conducting portions of the device against a suitable radiation and irradiating the gating portions of the device with said radiation. Conversely, the gate sensitivity is maintained without compromising certain other properties to be affected by irradiation by masking the gating portions of the device and irradiating the conducting portions and/or peripheral portions of the device.

Electron radiation is preferably used as a radiation source because of availability and inexpensiveness. However, it is contemplated that other kinds of radiation such as proton and neutron radiation may be preferable in some applications because of better defined range and better controlled depth of lattice damage. It is anticipated that any kind of radiation including alpha and gamma may be appropriate, provided it is capable of bombarding and disturbing the atomic lattice to create energy levels substantially decreasing the carrier recombination rate without correspondingly increasing the carrier generation rate.

Further, it is preferred that the radiation level of the electron radiation be greater than 1 Mev. Lower level is generally believed to result in substantial elastic collisions with the atomic lattice and therefore does not provide enough damage to the lattice in commercially feasible time periods. Moreover, such lower level radiation results in substantial electron scatter into the masked portions of the device, which is detrimental to maintenance of the other electrical characteristics of the device.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the present preferred embodiments of the invention and present preferred methods of practicing the invention are illustrated in which.

DESCRIPTION OF THE PREFERRED EMBODIMENTS

Figure 1:
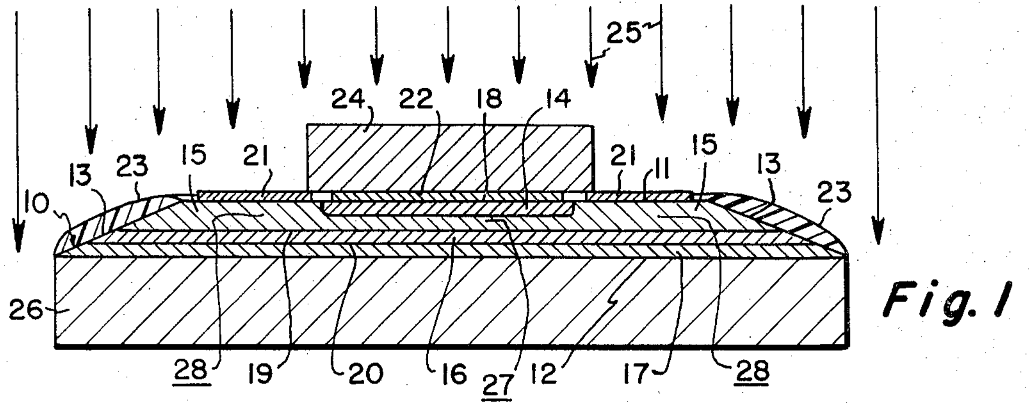
FIG. 1 is an elevational view in cross-section of an edge fired thyristor having gating portions selectively irradiated in accordance with the present invention.

Referring to FIG. 1, an edge fired silicon thyristor wafer or body 10 is shown having opposed major surfaces 11 and 12 and curvilinear side surfaces 13. The thyristor wafer 10 has cathode-emitter region 14 and anode- emitter region 17 of impurities of opposed conductivity type adjoining the major surfaces 11 and 12, respectively; and cathode-base region 15 and anode-base region 16 of impurities of opposite conductivity type in the interior of the wafer between emitter regions 14 and 17. The cathode-emitter region 14 and cathode-base region 15 are also of impurities of opposite conductivity type, as is anode-base region 16 and anode-emitter region 17. By this arrangement, thyristor wafer 10 is provided with a four layer impurity structure in which three PN junctions 18, 19 and 20 are provided.

The thyristor is provided with a periphery fired gate by adjoining cathode-base region 15 to the major surface 11 of outward portions thereof. Cathode-base region 15 thus extends annularly around cathode-emitter region 14. To provide electrical connections to the thyristor, metal contacts 21 and 22 make ohmic contact to cathode-base region 15 and cathode-emitter region 14, respecitvely, at major surface 11; and metal substrate 26 makes ohmic contact to anode-emitter region 17 at major surface 12. Atmospheric effects on the thyristor operation are substantially reduced by coating side surfaces 13 with a suitable passivating resin 23 such as a silicone or epoxy composition.

Selective irradiation is performed on thyristor wafer 10 by masking conducting portions 27 of wafer 10 with a circular shield plate 24 and annularly irradiating gating portions 28 of wafer 10 with electron radiation 25 of 2 Mev intensity. Shield plate 24 is mechanically positioned in contact with metal contact 22 to mask conducting portions 27 against radiation. Plate 24 is of any material of sufficient density and thickness to be opaque to the particular radiation used. For electron radiation, shield plate 24 may be standard, low carbon steel about ¼ inch thickness for tungsten or lead of about 5/32 inch thickness. After the radiation is completed, shield plate 24 is physically removed for reuse in subsequent irradiations.

Figure 2:
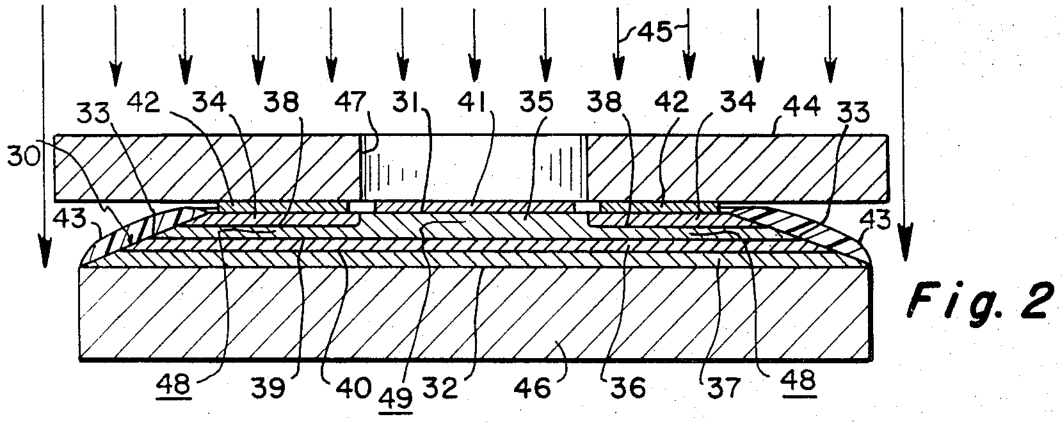
FIG. 2 is an elevational view in cross-section of a center fired thyristor having gating portions selectively irradiated in accordance with the present invention.

Referring to FIG. 2, center fired silicon thyristor wafer or body 30 is shown having opposed major surfaces 31 and 32 and curvilinear side surfaces 33. The thyristor wafer 30 has cathode-emitter region 34 and anode-emitter region 37 of impurities of opposite conductivity type adjoining major surfaces 31 and 32, respectively; and cathode-base region 35 and anode-base region 36 of impurities of opposite conductivity type in the interior of the wafer between emitter regions 34 and 37. Cathode-emitter region 34 and cathode-base region 35 are also of opposite conductivity type of impurities as is anode-base region 36 and anode-emitter region 37. By this arrangement, thyristor wafer 30 is provided with a four layer impurity structure in which three PN junctions 38, 39 and 40 are provided.

The thyristor is provided with a center fired gate by adjoining cathode-base region 35 to the major surface 31 at center portions thereof. Cathode-emitter region 34 thus extends around surface portions of region 35. To provide electrical connection to the thyristor wafer, metal contacts 41, 42 make ohmic contact to cathode-emitter region 34 and cathode-base region 35, respectively, at major surface 31; and metal substrate 46 makes ohmic contact to anode- emitter region 37 at major surface 32. Atmospheric effects on the thyristor operation are substantially reduced by coating side surfaces 33 with a suitable passivating resin 43 such as a silicone or epoxy composition.

Selective irradiation is performed on wafer 30 by masking conducting portions 48 of wafer 30 with annular shield plate 44 having a circular center opening 47 therein, and irradiating gating portions 49 of wafer 30 with electron radiation 45 of 2 Mev intensity through opening 47. Shield plate 44 is positioned by mechanically placing it in contact with metal contact 42 to mask conducting portions 48 against radiation while leaving gating portions 49 exposed. Plate 44 is of the same density and thickness as previously described for shield plate 24. After the radiation is completed, plate 44 is physically removed for reuse in subsequent irradiations.

Figure 3:
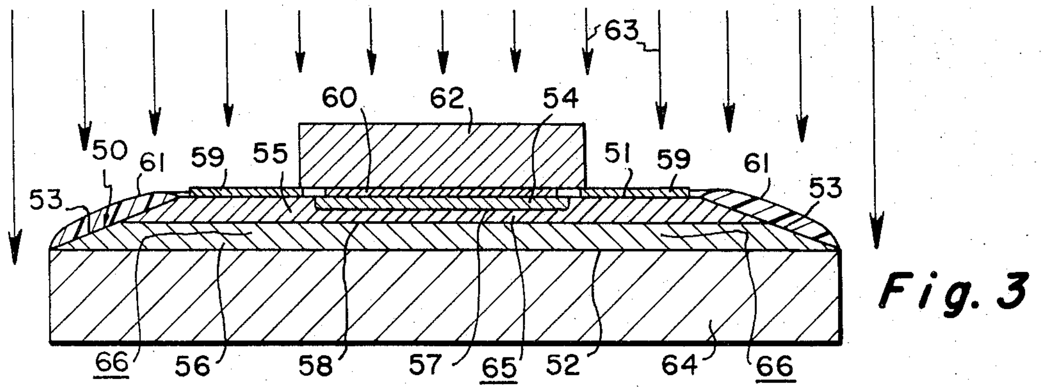
FIG. 3 is an elevational view in cross-section of an edge driven transistor having gating portions selectively irradiated in accordance with the present invention.

Referring to FIG. 3, an edge driven silicon transistor wafer or body 50 is shown having opposed major surfaces 51 and 52 and curvilinear side surfaces 53. The transistor wafer 50 has emitter and collector regions 54 and 56 of impurities of one conductivity type adjoining major surfaces 51 and 52, respectively, and base region 55 of impurities of the opposite conductivity type in the interior of the wafer 50 between emitter and collector regions 54 and 56. Two PN junctions 57 and 58 are thus present, junction 57 at the transition between regions 54 and 55 and junction 58 at the transition between regions 55 and 56.

The transistor is provided with an edge driven gate by adjoining base region 55 to major surface 51 at outward portions thereof. Base region 55 thus extends around emitter region 54. To complete the transistor, metal contacts 59 and 60 make ohmic contacts to emitter and base regions 54 and 55, respectively, at major surface 51, and metal substrate 64 makes ohmic contact to collector 56 at major surface 52. Atmospheric effects on transistor operation are substantially reduced by coating side surfaces 53 with a suitable passivating resin 61 such as a silicone or epoxy composition.

Selective radiation is performed on wafer 50 by masking conducting portions 65 of wafer 50 with circular shield plate 62 and annularly irradiating gating portions 66 of wafer 50 with electron radiation 63 of 2 Mev intensity. Plate 62 is of the same density and thickness as previously described for shield plate 24. Shield plate 62 is simply mechanically positioned in contact with metal contact 60 to mask conducting portions 65 against radiation while leaving gating portions 66 exposed. After irradiation is completed, shield plate 62 is physically removed for reuse in subsequent irradiations.

Figure 4:
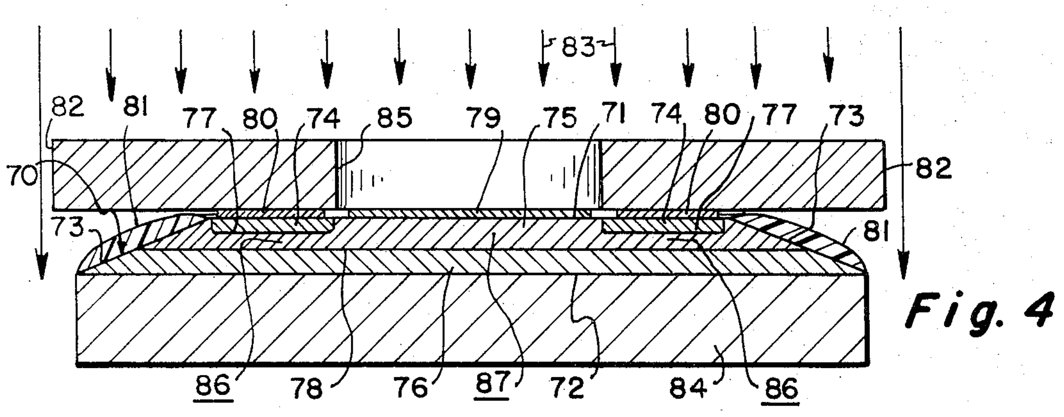
FIG. 4 is an elevational view in cross-section of a center driven transistor having gating portions selectively irradiated in accordance with the present invention.

Referring to FIG. 4, center driven silicon transistor wafer or body 70 is shown having opposed major surfaces 71 and 72 and curvilinear side surfaces 73. The transistor wafer 70 has emitter and collector regions 74 and 76 of impurities of one conductivity type adjoining major surfaces 71 and 72, respectively; and base region 75 of impurities of the opposite conductivity type in the interior of the wafer 70 between emitter and collector regions 74 and 76. By this arrangement, transistor wafer 70 is provided with a three layer impurity structure in which two PN junctions 77 and 78 are provided.

The transistor is center driven by adjoining base region 75 to the major surface 71 at center portions thereof. Emitter region 74 thus extends around surface portions of the base region 75. To provide electrical connection to the transistor wafer, metal contacts 79 and 80 make ohmic contact to base region 75 and emitter region 74, respectively, at major surface 71; and metal substrate 84 makes ohmic contact to collector region 76 at major surface 72. Atmospheric effects on the transistor operation are reduced by coating side surfaces 73 with a suitable passivating resin 81 such as a silicone or epoxy composition.

Selective radiation is performed on wafer 70 by masking conducting portions 86 of wafer 70 with an annular shield plate 82 having circular opening 85 therein, and irradiating gating portions 87 of wafer 70 with electron radiation 83 of 2 Mev intensity through opening 85. Shield plate 82 is mechanically positioned in contact with metal contact 79 to mask conducting portions 86 against radiation while leaving gating portions 87 exposed. Plate 82 is of the same density and thickness as previously described for shield plate 24. After irradiation is completed, shield plate 82 is physically removed for reuse in subsequent irradiations.

Figure 5:
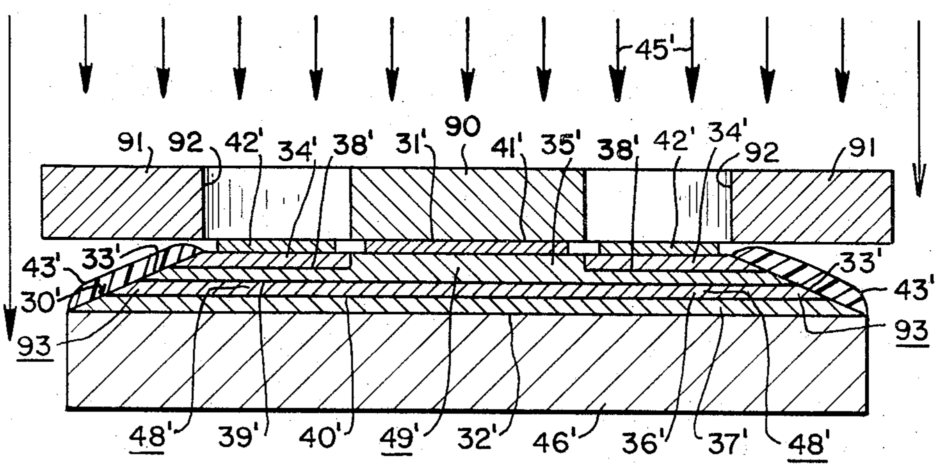
FIG. 5 is an elevational view in cross-section of a center fired thyristor similar to that shown in FIG. 2 having conducting protions selectively irradiated in accordance with the present invention.
Figure 6:
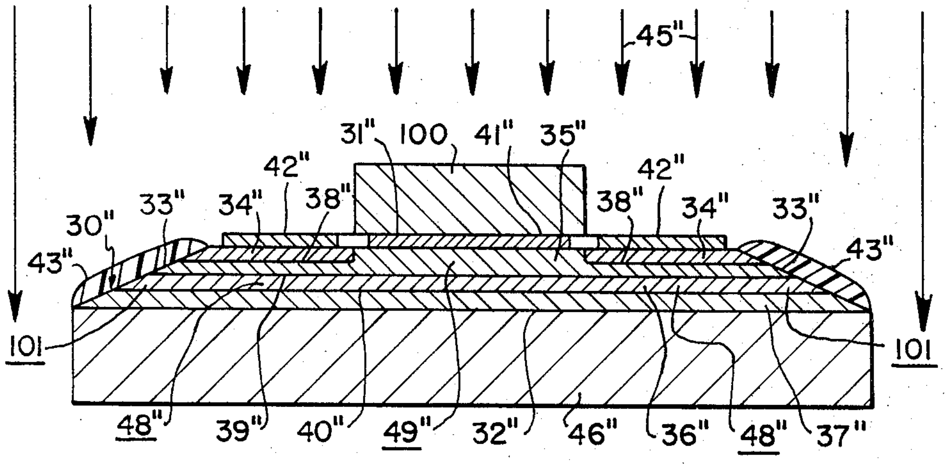
FIG. 6 is an elevational view in cross-section of a center fired thyristor similar to that shown in FIG. 2 having both conducting and peripheral portions selectively irradiated in accordance with the present invention.

The invention where the gate sensitivity is maintained while changing other electrical characteristics such as turn-off time, is shown by reference to FIGS. 5 and 6. The semiconductor device is a center fired thyristor as shown in FIG. 2. The masking of the thyristor is, however, changed so that the gating portions are masked while other portions of the device are irradiated.

Referring to FIG. 5, circular shield plate 90 is mechanically positioned in contact with metal contact 41′ to mask gating portions 49′ against radiation and annular shield plate 91 having circular opening 92 therein is mechanically positioned in contact with resin coating 43′ to mask peripheral portions 93 of the thyristor against radiation. Conducting portions 48′ are then irradiated with electron radiation 45′ of 2 Mev intensity through opening 92 around plate 90 to substantially reduce the turn-off time of thyristor while maintaining the gate sensitivity of the device.

Referring to FIG. 6, circular shield plate 100 is mechanically positioned in contact with metal contact 41″ to mask gating portions 49″ against radiation. Conducting portions 48″ and peripheral portions 101 of the device are thereafter simultaneously irradiated with electron radiation 45″ of 2 Mev intensity around plate 100 to substantially reduce the turn-off time and substantially increase the blocking voltage while maintaining the gate sensitivity of the device.

It should be noted that by reference to FIGS. 1 to 4, it is readily apparent that the procedures shown by FIGS. 5 and 6 can be applied to edge fired thyristors and to transistors. The shielding is simply reversed to selectively irradiate the conducting portions of periphery gated devices.

The merits of the invention were illustrated by selectively irradiating a group of thyristors with a forward current capacity of 1500 amps similar to that shown in FIGS. 2 and 6 with and without masking. The thyristor wafers were 1.28 inches in diameter with a cathode-emitter region, because of beveled side surfaces, of 1.08 inches in diameter. Some thyristors were first indiscriminately irradiated by an electron beam of 2 Mev intensity. The gate current at triggering ($I_g$) was measured before irradiation and after radiation to different electron exposures. The results are shown in Table I:

TABLE I

| Run No. | 0 | Radiation Exposure in Electrons/cm² 9 × 10¹² | 1.9 × 10¹³ |
|---|---|---|---|
| 1 | 47⁽¹⁾ | 57 | 62 |
| 2 | 66 | 95 | 111 |
| 3 | 41 | 56 | 63 |
| 4 | 132 | 180 | 203 |

(1) Gate currents were measured in milliamps at 25°C.

Similar tests were run on another group of thyristors using procedures similar to that shown in FIG. 2 without masking. The thyristor wafers were again 1,28 inches in diameter with a cathode-emitter region of 1.08 inches in diameter. As before, all thyristors were indiscriminately irradiated by an electron beam of 2 Mev intensity and the gate current at triggering ($I_g$) measured before irradiation and after different radiation exposures. The results are shown in Table II.

TABLE II

| Run No. | 0 | Radiation Exposure in Electrons/cm² 1 × 10¹³ | 7.9 × 10¹³ |
|---|---|---|---|
| 1 | 58⁽¹⁾ | 71 | 230 |
| 2 | 51 | 60 | 160 |
| 3 | 67 | 84 | 218 |
| 4 | 52 | 62 | 136 |
| 5 | 76 | 107 | 355 |
| 6 | 54 | 60 | 250 |

(1) Gate currents were measured in milliamps at 25°C.

As shown by Tables I and II the unmasked irradiation resulted in substantial increses in gate current. However, the forward voltage drop was also correspondingly increased by such indiscriminate irradiation.

To illustrate that forward voltage drop and gate sensitivity can be selectively varied by the present invention, a group of thyristors similar to those tested in relation to Tables I and II were tested for forward voltage drop and gate current before irradiation and after selective radiation to different exposures. The thyristor wafers were 1.28 inches in diameter with a cathode-emitter region of 1.08 inches in diameter. The first four runs of the group were simply "bulk" irradiated without any masking. The last four runs of the group had their gating portions masked as shown in FIG. 6 with a tungsten slug having a diameter of 13/16 inch and a thickness of ⅛ inch, and thereafter had their contacting and peripheral portions selectively irradiated. All thyristors were irradiated by an electron beam of 2 Mev intensity. The results are shown in Table III.

As shown by Table III, the forward voltage drop is significantly increased both by bulk and selective irradiation since it was irradiated in both instances. Gate current on the other hand was significantly increased only where the gate portion was irradiated. Gate current was maintained essentially unchanged where the gating portions were selectively masked prior to irradiation.

To further illustrate the invention by direct comparison, four groups of thyristors with a forward current capacity of 1500 amperes were prepared. The thyristor wafers were again 1.28 inches in diameter with a cathode-emitter region of 1.08 inches in diameter. The first group was indiscriminately irradiated with a 2 Mev electron radiation and the electrical characteristics measured before and after irradiation. The second

TABLE III

| Run No. | Shielded | Radiation Exposure in Electrons/cm² 0 | | 9.0 × 10¹² | | 1.9 × 10¹³ | |
|---|---|---|---|---|---|---|---|
| | | $V_f$(1) | $I_g$(2) | $V_f$ | $I_g$ | $V_f$ | $I_g$ |
| 1 | No | 1.55 | 47 | 1.86 | 57 | 2.27 | 62 |
| 2 | No | 1.52 | 66 | 1.87 | 95 | 2.26 | 111 |
| 3 | No | 1.80 | 41 | 2.54 | 56 | (3) | 63 |
| 4 | No | 1.89 | 132 | 2.55 | 180 | (3) | 203 |
| 5 | Yes | 1.90 | 132 | 2.09 | 140 | 2.36 | 133 |
| 6 | Yes | 1.77 | 55 | 1.95 | 57 | 2.15 | 56 |
| 7 | Yes | 1.48 | 36 | 1.60 | 38 | 1.73 | 36 |
| 8 | Yes | 1.56 | 75 | 1.66 | 77 | 1.83 | 75 |

(1) Forward voltage drop is measured in volts at 1500 amps and 25°C.
(2) Gate current at firing is measured in milliamps at 25°C.
(3) Too high to measure.

group was selectively irradiated with a 2 Mev electron beam with their conducting portions masked and the same electrical characteristics measured before and after irradiation. The third group of thyristors was selectively irradiated with a 2 Mev electron beam with their gating portions masked and the same electrical characteristics measured before and after irradiation. The fourth group comprised the measurement control and were not irradiated at all; they simply had their electrical characteristics measured with the other groups before and after the other groups were irradiated.

The results of the tests are shown in Table IV.

The selectively irradiated thyristors which had their gating portions masked (Run Nos. 11 through 15) showed reduction in turn-off time to about one-half its original value while the gate sensitivity remained essentially unchanged. The forward voltage drop was also substantially increased by this selective irradiation of the conducting portion.

This series of tests demonstrated that the invention could substantially reduce gate sensitivity without significantly affecting the conducting electrical characteristics of the device or that the invention could substantially reduce turn-off time without affecting the gate sensitivity of the device.

TABLE IV

| Run No. | Portion Shielded | Radiation Exposure in Electrons/cm² 0 | | | 6 × 10¹³ | | |
|---|---|---|---|---|---|---|---|
| | | $V_f$(1) | $I_g$(2) | $t_q$(3) | $V_f$ | $I_g$ | $t_q$ |
| 1 | None | 1.06 | 53 | 200 | 1.60 | 95 | 16 |
| 2 | None | 1.06 | 67 | 250 | 1.60 | 130 | 12 |
| 3 | None | 1.04 | 60 | 200 | 1.55 | 130 | 11 |
| 4 | None | 1.09 | 67 | 170 | 1.75 | 120 | 10 |
| 5 | None | 1.07 | 60 | 190 | 1.69 | 94 | 11 |
| 6 | Conducting(4) | 1.06 | 67 | 220 | 1.06 | 126 | — |
| 7 | Conducting | 1.07 | 54 | — | 1.02 | 100 | — |
| 8 | Conducting | 1.06 | 60 | 140 | 1.06 | 105 | — |
| 9 | Conducting | 1.09 | 40 | 120 | 1.07 | 86 | — |
| 10 | Conducting | 1.20 | 67 | — | 1.13 | 112 | — |
| 11 | Gating(5) | 1.15 | 67 | 165 | 1.86 | 68 | 48 |
| 12 | Gating | 1.07 | 40 | 190 | 1.53 | 40 | 53 |
| 13 | Gating | 1.08 | 60 | — | 1.66 | 60 | 88 |
| 14 | Gating | 1.13 | 120 | 110 | 1.77 | 120 | 31 |
| 15 | Gating | 1.07 | 55 | 190 | 2.07 | 55 | 65 |
| 16 | Control(6) | 1.14 | 53 | — | 1.21 | 47 | — |
| 17 | Control | 1.13 | 54 | 150 | 1.18 | 47 | — |
| 18 | Control | 1.10 | 54 | 150 | 1.08 | 49 | — |
| 19 | Control | 1.10 | 46 | 170 | 1.14 | 46 | — |
| 20 | Control | 1.06 | 67 | 170 | 1.12 | 75 | — |

(1) Forward voltage drop is measured in volts at 625 amps and 25°C.
(2) Gate current is measured in milliamps at 25°C.
(3) Turn-off time is measured in microseconds at 25°C.
(4) The conducting portions were masked with a steel annulus having 1½ inches outside diameter, ⅝ inch inside diameter and ¼ inch thickness.
(5) The gating portions were masked with a steel slug having 3/16 inch diameter and ¼ inch thickness.
(6) The control thyristors were not irradiated at all; they merely had their electrical characteristics measured at the same time and with the same equipment used to measure the characteristics of the other thyristors which were irradiated.

As shown by Table IV, the indiscriminately irradiated thyristors (Run Nos 1 through 5) showed a substantial increase both in gate current and forward voltage drop while the turn-off time reduced to almost a tenth of its value before irradiation. This was as previously observed; see U.S. patent application Ser. No. 324,718, filed Jan. 18, 1973.

The selectively irradiated thyristors which had their conducting portions masked (Run Nos. 6 through 10) showed substantial decrease in gate sensitivity (i.e. increase in gate current) on irradiation while the forward voltage drop remained essentially unchanged.

Further, it is observed that the permanence and range of control of gate current is greater with selective irradiation than was previously attained with sandblasting of commercial devices.

The invention thus has utility in three roles. The first is to routinely reclaim or optimize the yield of devices which are or would be rejected because the gate current to fire is too low to meet marketing requirements or the turn-off time is too high to meet marketing requirements. The second is to routinely permit tailoring of the electrical characteristics of semiconductor devices to customer specification with a flexibility and precision heretofore not possible. And the third is to permit the design of devices having lower gate sensitivity than previous achievement with low forward voltage drop configurations. The latter role is attainable because high base impurity concentrations are not needed to attain high gate current with the present invention.

While presently preferred embodiments have been shown and described with particularity, it is distinctly understood that the invention may be otherwise variously performed within the scope of the following claims.

What is claimed is:

1. A method of controlling gate sensitivity of a gated semiconductor device without significantly affecting other electrical characteristics of the device comprising the steps of:

a. masking against radiation from a radiation source a portion of the semiconductor device selected from at least the group consisting of the gating and conducting portions; and b. thereafter irradiating unmasked portions of the semiconductor device with the radiation source.

2. A method of controlling gate sensitivity of a gated semiconductor device without significantly affecting other electrical characteristics of the device as set forth in claim 1 wherein:

the radiation source is an electron beam.

3. A method of controlling gate sensitivity of a gated semiconductor device without significantly affecting other electrical characteristics of the device as set forth in claim 2 wherein:

the electron beam has an intensity greater than about 1 Mev.

4. A method of decreasing the gate sensitivity of a gated semiconductor device without significantly increasing the forward voltage drop of the device comprising the steps of:

a. masking against radiation from a radiation source conducting portions of the semiconductor device; and b. thereafter irradiating gating portions of the semiconductor device with the radiation source.

5. A method of decreasing gate sensitivity of a gated semiconductor device without significantly increasing the forward voltage drop of the device as set forth in claim 4 wherein:

the radiation source is an electron beam.

6. A method of decreasing gate sensitivity of a gated semiconductor device without significantly increasing the forward voltage drop of the device as set forth in claim 5 wherein:

the electron beam has an intensity greater than about 1 Mev.

7. A method of maintaining gate sensitivity of a gated semiconductor device while changing other electrical characteristics of the device comprising the steps of:

a. masking against radiation from a radiation source gating portions of the semiconductor device; and b. thereafter irradiating conducting portions of the semiconductor device against radiation from a radiation source.

8. A method of maintaining gate sensitivity of a gated semiconductor device while changing other electrical characteristics of the device as set forth in claim 7 wherein:

the radiation source is an electron beam.

9. A method of maintaining gate sensitivity of a gated semiconductor device while changing other electrical characteristics of the device as set forth in claim 7 comprising the additional step of masking peripheral portions of the semiconductor device against radiation from the radiation source prior to said irradiation step.

10. A method of maintaining gate sensitivity of a gated semiconductor device while changing other electrical characteristics of the device as set forth in claim 7 comprising in addition:

irradiating peripheral portions of the semiconductor device while irradiating the conducting portions of the device.

11. A gated semiconductor device comprising:

semiconductor body comprising a conducting portion and a gating portion, said conducting portion having been irradiated to change electrical characteristics of the device, and said gating portion having been nonirradiated to maintain gate sensitivity of the device.

12. A gated semiconductor device as set forth in claim 11 wherein:

the semiconductor body comprises in addition a peripheral portion, said peripheral portion having been irradiated to increase blocking voltage while maintaining the forward voltage drop of the device.

13. A gated semiconductor device comprising:

a semiconductor body comprising a gating portion and a conducting portion, said gating portion having been irradiated to increase gate current of the device, and said conducting portion having been nonirradiated to maintain the forward voltage drop of the device.

* * * * *